(12) United States Patent
Yang et al.

(10) Patent No.: US 9,948,320 B1
(45) Date of Patent: Apr. 17, 2018

(54) SEMI-DYNAMIC BACKEND CODER FOR DATA COMPRESSION

(71) Applicant: AVAGO TECHNOLOGIES GENERAL IP (SINGAPORE) PTE. LTD., Singapore (SG)

(72) Inventors: Yuqing Yang, Shanghai (CN); Han Fang, Shanghai (CN); Shaohua Yang, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/705,505

(22) Filed: Sep. 15, 2017

(51) Int. Cl.
*H03M 7/34* (2006.01)
*H03M 7/30* (2006.01)

(52) U.S. Cl.
CPC ....... *H03M 7/6058* (2013.01); *H03M 7/3088* (2013.01); *H03M 7/6011* (2013.01)

(58) Field of Classification Search
CPC . H03M 7/6058; H03M 7/3088; H03M 7/6011
USPC ...................................... 341/51, 87
See application file for complete search history.

(56) References Cited

U.S. PATENT DOCUMENTS

| 4,626,829 A | 12/1986 | Hauck |
| 8,791,843 B2 * | 7/2014 | Cohen ............. H03M 7/3079 341/51 |
| 2016/0314140 A1 | 10/2016 | Gupta |

* cited by examiner

*Primary Examiner* — Khai M Nguyen
(74) *Attorney, Agent, or Firm* — Sheridan Ross P.C.

(57) ABSTRACT

Methods and systems are provided for the compression and decompression of data. The compression and decompression of data may include partitioning the data into chunks, analyzing the individual chunks to determine the best compression and decompression encoders to utilize for the next data chunk of a data file. In compressing and decompressing using the mentioned technique, the data is delivered to the requesting client in an efficient and speedy manner.

20 Claims, 9 Drawing Sheets

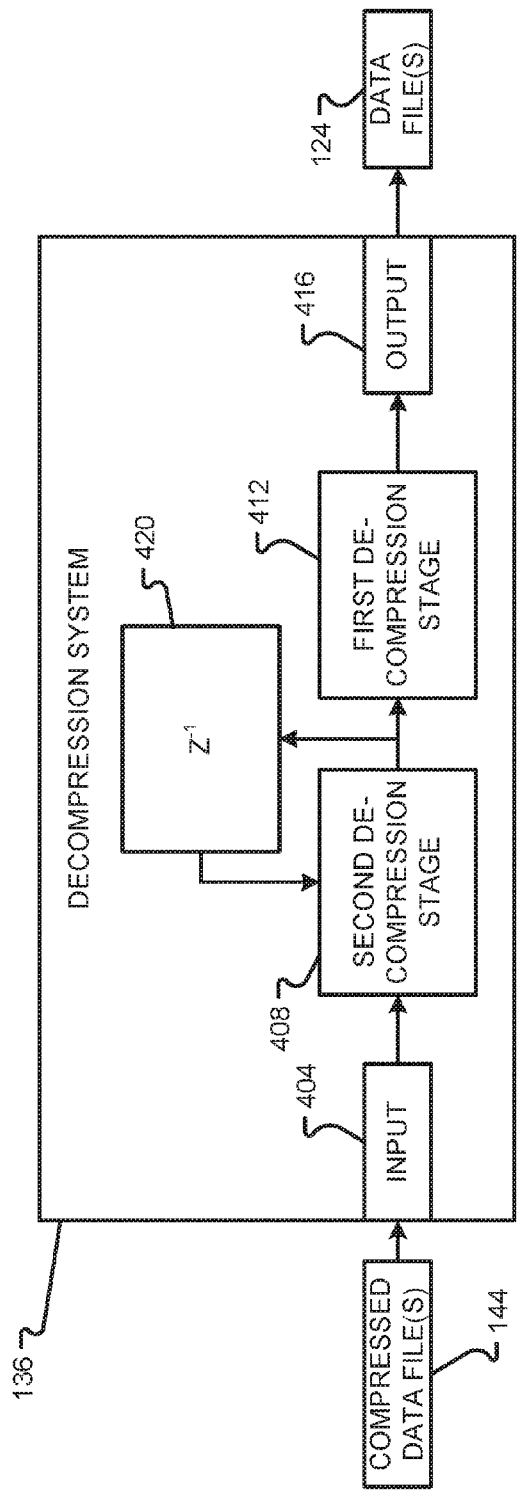
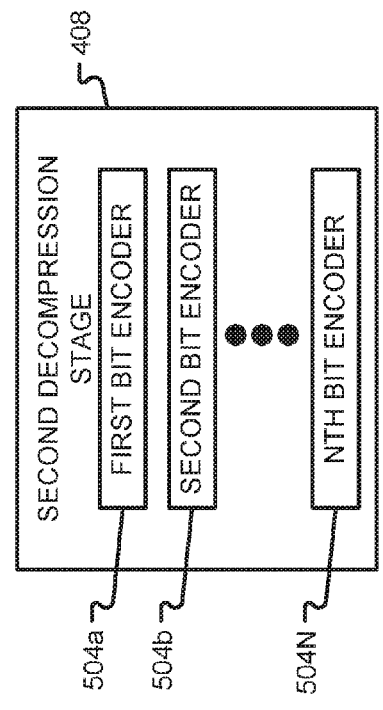
FIG. 4
FIG. 5

SEMI-DYNAMIC BACKEND CODER FOR DATA COMPRESSION

FIELD OF THE DISCLOSURE

Example embodiments are generally directed toward the compression and decompression of data using a semi-dynamic coder.

BACKGROUND

Data compression involves encoding information using fewer bits than the original representation and data de-compression involves reversing the process of compression. Compression is useful because it reduces resources required to store and transmit data. Compression can be either lossy or lossless.

Lossless compression reduces bits by identifying and eliminating statistical redundancy. Lossless compression typically employs statistical redundancy to represent data without losing any information, so that the process is reversible. Lossy compression reduces bits by removing unnecessary or less important information. Lossy compression accepts some loss of information, dropping nonessential detail from the data source to save storage space.

One example of compression uses the DEFLATE type of compression in which a pre-processor is combined with a coding methodology as the backend for further compression. The backend methodology is usually either a static backend coder or a dynamic backend coder. A static backend coder has pre-defined encoding which will not change during processing. The advantage of this method is that the compression is relatively simple and fast, but the compression ratio is not optimized. A dynamic backend coder, in comparison, changes the encoding for subsequent data based on analysis performed on the initial input data. Using technique dynamic backend coder improves the compression ratio but extra latency is experienced due to the statistics updating. Furthermore, extra bits and complex formats are required in the final compressed files to inform the de-compression process of the incoming data type of the compressed data file, as well as the optimum de-compression technique to implement.

BRIEF DESCRIPTION OF THE DRAWINGS

The present disclosure is described in conjunction with the appended figures, which are not necessarily drawn to scale:

FIG. 4 is a block diagram of a decompression system in accordance with at least some embodiments of the present disclosure;

FIG. 5 is a block diagram depicting details of a second decompression stage in accordance with at least some embodiments of the present disclosure;

DETAILED DESCRIPTION

It is with respect to the above issues and other problems that the embodiments presented herein were contemplated. Embodiments of the present disclosure will be described in connection with a semi-dynamic system of compressing and decompressing data. As will be described in further detail herein, the present disclosure provides a semi-dynamic coding scheme which achieves a balance between compression performance and latency. In the proposed semi-dynamic scheme, the statistics models are real-time adapted based on existing compression/decompression data (e.g., performance data), instead of introducing latency and making adjustments based on compression statistics for an entire block of data.

Figure 1A:
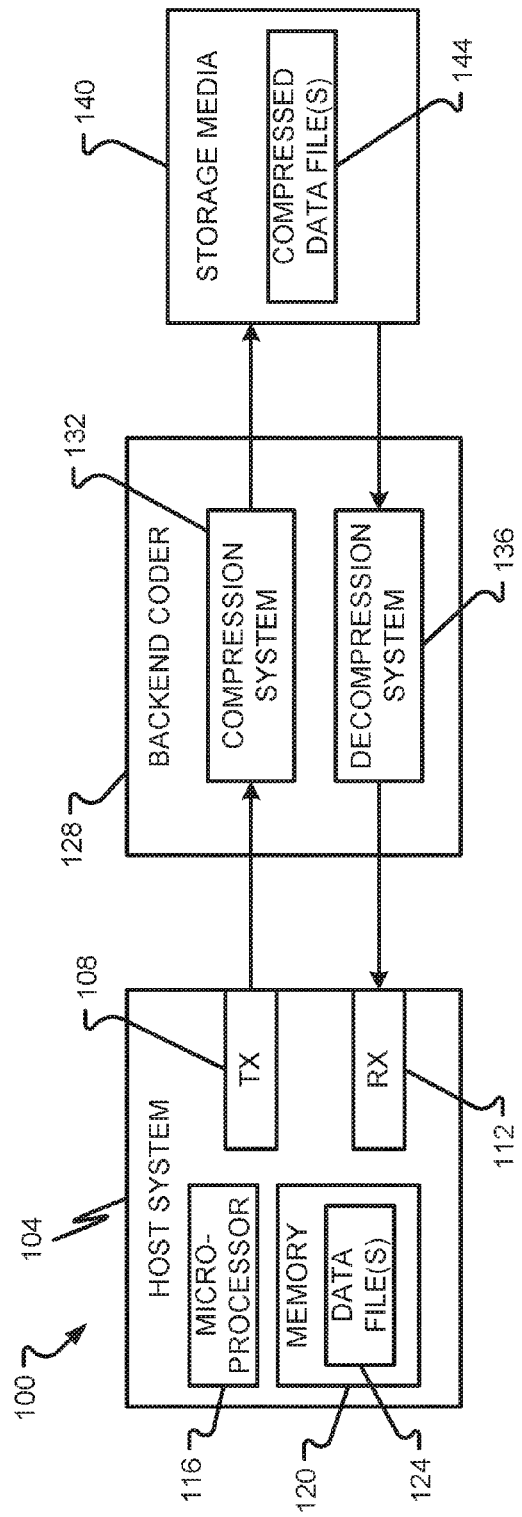
FIG. 1A is a block diagram of a first system for compressing and decompressing data in accordance with at least some embodiments of the present disclosure.

FIG. 1A depicts a block diagram of a system 100 for compressing and decompressing data (e.g., in the form of data files, data streams, etc.) in accordance with embodiments of the present disclosure. The compression and decompression system 100 may include a host system 104, a backend coder 128, and a storage media 140. The host system 104 may include a microprocessor 116, a memory unit 120 that stores data files 124, a data transmitting mechanism 108 and a data receiving mechanism 112. The backend coder 128 may include a compression system 132 and a decompression system 136. As can be appreciated, the backend coder 128 may be executed in the host system 104, as part of a memory controller for the storage media 140, by a server residing between the host system 104 and a controller of the storage media 140, or a combination thereof.

In some embodiments, a data file 124 from a memory unit 120 may be transmitted out of the host system 100 through a transmission mechanism 108 for processing into a compression system 132 that resides within the backend coder 128. The compression system 132 may then process the data file(s) 124 to create one or more compressed data files 144. Next, the compressed data file(s) 144 may be transmitted to the storage media 140 to be stored until requested by the host system 104 or some other host system 104. In some embodiments, the storage media 140 may include any type of data storage device or collection of devices. Non-limiting examples of a storage media 140 include a hard disk drive, a flash memory device, a RAID storage system, a RAID storage device, a RAM, a volatile memory device, a non-volatile memory device, or any combination thereof. In some embodiments, the storage media 140 may correspond to a memory device that resides within the host system 104 or is directly connected to the host system 104 via a direct wired connection.

The transmission mechanism 108 may correspond to a physical and/or logical interface between the backend coder 128 and host system 104. As an example, the transmission mechanism 108 may include a serial data port, an Ethernet port, a USB port, a PCIe interface, a SCSI port, etc. Likewise, the receiving mechanism 112 may correspond to a physical and/or logical interface between the backend coder 128 and host system 104. In some embodiments, the receiving mechanism 112 and transmitting mechanism 108 may be provided in a single physical device and may operate as a combined transmitter/receiver or transceiver.

The compressed data file(s) 144 may be maintained in the storage media 140 and made available for later access by the host system 104 or other host systems. In some embodiments, a host system, such as host system 104, may submit a request for the compressed data file(s) 144 to the storage media 140 or a controller of the storage media 140. In some embodiments, the request for data file(s) 144 may be transmitted sometime after the compressed data file(s) 144 were stored in the storage media 140. The request, in some embodiments, may be transmitted by the host system 104 in the form of a read request. The read request may be processed by a controller of the storage media 140 and the decompression system 136 may process the read request by accessing or retrieving the compressed data file(s) 144 from the storage media 140 and then processing the compressed data file(s) 144 with the decompression system 136. In some embodiments, the compressed data file(s) 144 are decompressed by the decompression system 136 and returned to the host system 104 via the receiving mechanism 112. The data file(s) 124 returned back to the host system 104 may be similar or identical to the data file(s) 124 that were transmitted from the host system 104 to the storage media 140. Thus, the compression and decompression of the data file(s) 124 may be considered lossless in some embodiments. It should be appreciated that lossy compression/decompression algorithms may also be performed within the backend coder 128 without departing from the scope of the present disclosure. The host system 104 may then store the data file(s) returned from the storage media 140 into its local memory 120. Once in local memory 120, the microprocessor 116 of the host system 104 can manipulate the data file(s) 124 for presentation via a user interface of the host system 104 or for editing with the host system 104.

Although labeled as data file(s) 124, it should be appreciated that the data processed by the backend coder 128 may include one or more of electronic data files, a data stream, a plurality of data files, or combinations thereof. Specific, but non-limiting examples of electronic data files that can be processed by the backend coder 128 include video files (e.g., MP4 files, AVI files, FLV files, WMV files, MOV files, HTML files, GIF files, etc.), audio files (e.g., MP3 files, Opus files, WAV files, etc.), application/document files (e.g., Word files, Excel files, .pdf files, email messages, etc.), database files, or combinations thereof. As will be discussed in further detail herein, the backend coder 128 may be constructed to optimally compress and decompress data files of different types in a dynamic and efficient way. Moreover, a single data file may be compressed with a number of different compression algorithms as determined by the compression system 132 of the backend coder 128 during compression of the data file(s) 124.

Figure 1B:
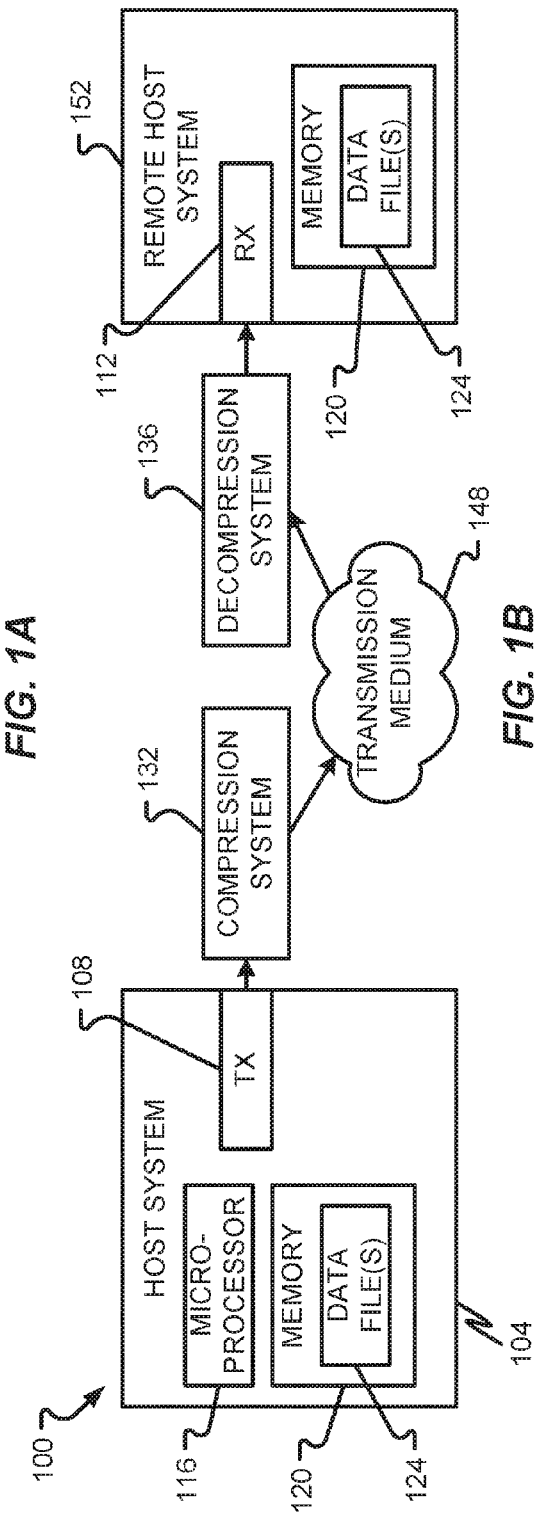
FIG. 1B is a block diagram of another system for compressing and decompressing data in accordance with at least some embodiments of the present disclosure.

FIG. 1B is a block diagram of a system 100 for compressing and decompressing data files between different host systems with at least some embodiments of the present disclosure. The compression and decompression system 100 may include a host system 104, which may be similar or identical to the host system 104 of FIG. 1A. The system 100 is further shown to include a compression system 132, a decompression system 136, a transmission medium 148, and a remote host system 152. The remote host system 152 may be similar to the host system 104 except that the remote host system 152 is physically separated from the host system 104 by a distance and by the transmission medium 148. Although not depicted, the remote host system 152 may include its own microprocessor 116. The transmission medium 148 may correspond to any type of known computer network, wired transmission system, wireless transmission system, or the like. Examples of a transmission medium 148 include coaxial cables, copper wire, fiber optic wires. Alternatively or additionally, the transmission medium 148 may take the form of acoustic, RF, and/or light waves, such as those generated during radio-wave and infra-red data communications. In some embodiments, the transmission medium 148 may be part of a communication network. Examples of communication networks that include the transmission medium 148 include, without limitation, the Internet, a Local Area Network (LAN), a data network, a Wireless network, etc.

In the depicted embodiment, the host system 108 has the transmitting mechanism 108 whereas the remote host system 152 has the receiving mechanism 112. It should be appreciated, however, that both host systems 104, 152 have both transmitting mechanisms 108 and receiving mechanisms 112 (or transceivers) to facilitate a two-way sharing of data between the systems. The transmitting mechanism 108 and/or receiving mechanism 112 may be integral to the host systems 104, 152. Likewise, the compression and decompression systems may be incorporated into the host systems 104, 152 without departing from the scope of the present disclosure. As an example, the host system 104 may actually compress data files 124 prior to committing the data files to the transmitting mechanism 108 for transmission across the transmission medium 148. Likewise, the remote host system 152 may first receive a compressed data file at the receiving system 112 prior to decompressing the data file(s) with the decompression system 136. Thus, the compression system 132 may be internal to the host system 104 and may reside between the microprocessor 116 and transmitting mechanism 108. The decompression system 136 may similarly be positioned within the remote host system 152 and behind the receiving mechanism 112.

In some embodiments, a data file 124 from the memory unit 120 of host system 104 may be transmitted via the transmission mechanism 108 for processing by the compression system 132. Conversely, the compression system 132 may first compress the data file(s) 124 prior to the transmission mechanism 108 preparing one or more electronic messages (e.g., packets) for transmission across the transmission medium 148.

The electronic messages carrying the compressed data file(s) may be conveyed across the transmission medium 148 to the remote host system 152. The data files may then be decompressed and received at the remote host system 152. Thereafter, the decompressed data file(s) 124 may be stored in memory 120. As discussed above, the data files may first be decompressed prior to arriving at the receiving mechanism 112. In alternative embodiments, the compressed data files may be received at the receiving mechanism 112 after which the compressed data files are decompressed by the decompression system 136. remote host system 152

Figure 2:
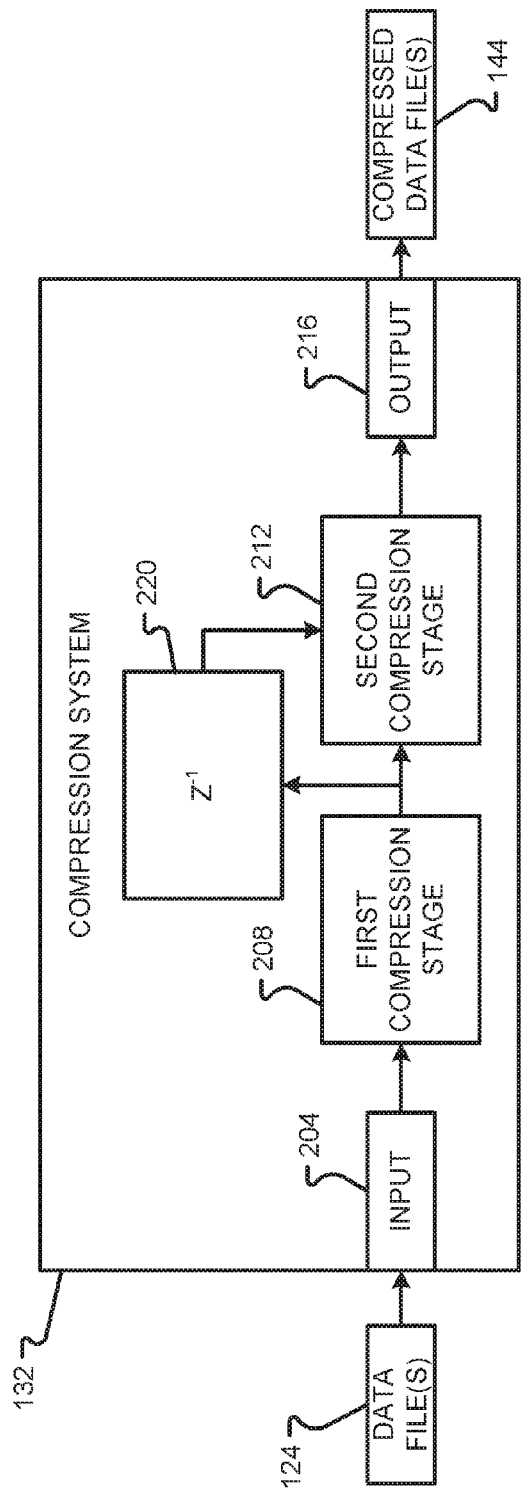
FIG. 2 is a block diagram of a compression system in accordance with at least some embodiments of the present disclosure.

FIG. 2 is a block diagram of a compression system 132 in accordance with at least some embodiments of the present disclosure. The compression system 132 may include an input 204 which may receive data file(s) 124, a first compression stage 208, a second compression stage 212, a performance feedback circuit 220, and an output 216 that delivers compressed data file(s) 144. As will be discussed in further detail herein, the compression system 132 may receive data file(s) 124 in a first format having a first file size (e.g., as measured in an amount of computer memory required to store the data file(s) 124). The compression system 132 may process the data file(s) 124 and produce corresponding compressed data file(s) 144 having a second format and a second file size that is less than or equal to the first file size. Performance of the compression system 132 may be quantified by the difference between the file size of the data file(s) 124 and the file size of the compressed data file(s) 144. Performance of the compression system 132 may also be quantified by how quickly data file(s) 124 are processed by the compression system 132. As will be discussed herein, the components of the compression system 132 are provided to balance both the speed of the compression system 132 as well as the system's 132 ability to reduce the size of the data file(s) 124.

In some embodiments, the first compression stage 208 implements a lossless data compression technique. The first compression stage 208 may utilize one or more circuits that compress the data file(s) 124 with a Lempel-Ziv (LZ) compression algorithm. Non-limiting examples of compression algorithms that may be implemented in the first compression stage 208 include the LZ77 algorithm, the LZ78 algorithm, the LZS (or Stac) algorithm, or any other type of lossless compression algorithm. In some embodiments, the data file 124 may enter the first compression stage 208 through the input 204. The first compression stage 208 may be directly connected to the second compression stage 212, meaning that no other processing component, data buffer, or the like is positioned between the first compression stage 208 and the second compression stage 212. This architecture effectively ensures that the compression system 132 has minimal latency because of the output of the first compression stage 208 is directly provided to the second compression stage 212. In other words, the output of the first compression stage 208 is received at the second compression stage 212 immediately after being produced by the first compression stage 208. There is no delay or buffering of the data as it passes from the first compression stage 208 to the second compression stage 212.

The output of the first compression stage 208 is also tapped by the performance feedback circuit 220. The performance feedback circuit 220 helps to provide the second compression stage 212 with compression statistics (e.g., information predicting a difference between an input size of the second compression stage and an output size of the second compression stage). The compression statistics can be used by the second compression stage 212 to select a bit encoder for use with subsequent portions of the data file.

In some embodiments, the data file(s) 124 may be divided into chunks before being sent to the first compression stage 208 through the input 204. Alternatively, the data file(s) 124 may be sub-divided into chunks after compression by the first compression stage. In any event, the data file(s) 124 area provided to the second compression stage 212 (and possibly the first compression stage 208) on a chunk-by-chunk basis. As a non-limiting example, each chunk of the data file(s) 124 may be processed by the first compression stage 208 and then the second compression stage 212. The compressed chunks output by the second compression stage 212 may be collected at the output 216 (e.g., in a data buffer) and output as the compressed data file(s) 144. Alternatively, the compressed chunks may be transmitted immediately by the output 216 upon receiving such chunks from the second compression stage 212. The compressed data file(s) 144 may be transmitted by a transmitting mechanism 108 of the host system 104 or stored in storage media 140 (e.g., with the assistance of a storage controller or the like).

Figure 3:
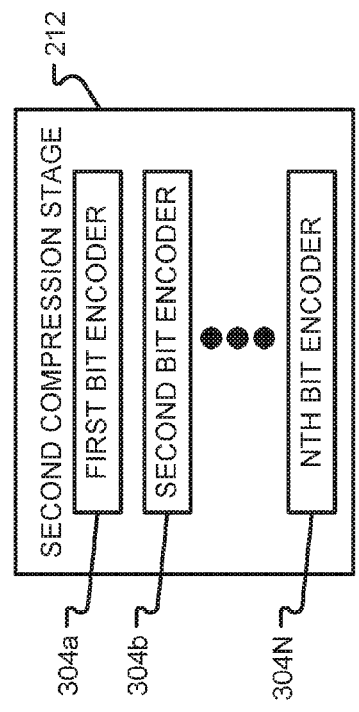
FIG. 3 is a block diagram depicting details of a second compression stage in accordance with at least some embodiments of the present disclosure.

FIG. 3 depicts additional details of a second compression stage 212 in accordance with at least some embodiments of the present disclosure. The second compression stage 212 is shown to include a number of bit encoders 304a-N, where N is any integer value greater than or equal to two. Thus, the second compression stage 212 may be considered to have a plurality of bit encoders. In some embodiments, each bit encoder 304a-N corresponds to a discrete bit encoder that separately processes the input received at the second compression stage 212. Each bit encoder 304a-N may process the input received at the second compression stage 212 in parallel with one another. Thus, to the extent that the second compression stage 212 receives the output of the first compression stage 208 as a data file in a chunk-by-chunk basis, each bit encoder 304a-N can be considered to compress that data file in parallel on a chunk-by-chunk basis.

In some embodiments, each bit encoder 304a-N corresponds to a discrete encoder or compression circuit (e.g., a collection of digital circuit components that implement a different bit encoding technique). In some embodiments, each bit encoder 304a-N corresponds to a discrete routine executed by the second compression stage 212 to apply a different encoding technique to the input received at the second compression stage 212. The information generated at the performance feedback circuit 220 may be used to select which bit encoder 304a-N output is used as the actual output of the second decompression stage 212. Outputs of the other bit encoders 304a-N may be analyzed for compression performance and may contribute to a selection of a different bit encoder 304a-N for use with subsequent chunks of data.

With reference now to FIG. 4, additional details of a decompression system 136 will be described in accordance with at least some embodiments of the present disclosure. As will be appreciated by those of skill in the compression/decompression arts, the decompression system 136 may have similar or identical components to the compression system 132, except that such components may be arranged to reverse the compression process performed by the compression system 132. In the depicted embodiment, the decompression system includes an input 404, a second decompression stage 408, a first decompression stage 412, a performance feedback circuit 420, and an output 416. The second decompression stage 408 may be similar to the second decompression stage 212 of the compression system 132 except that the second decompression stage 408 applies an inverse process to compressed data file(s) 144 as compared to the second compression stage 212. The first decompression stage 412 may be similar to the first compression stage 208 of the compression system 132 except that the first decompression stage 412 may apply an inverse process to the output of the second decompression stage 408 as compared to the first compression stage 208. The performance feedback circuit 420 may be similar or identical to the performance feedback circuit 220 except that the performance feedback circuit 420 analyzes compression performance (or more accurately decompression performance) for the various bit encoders of the second decompression stage 408. The information generated at the performance feedback circuit 420 may be used to select which bit encoder output is used as the actual output of the second decompression stage 408.

In contrast to the compression system 132, the decompression system 136 has the second decompression stage 408 process the compressed data files(s) 144 first. In some embodiments, the second decompression stage 408 processes the compressed data file(s) 144 on a chunk-by-chunk basis. The output of the second decompression stage 408 is provided directly to the first decompression stage 412. In some embodiments, this means that the output of the second decompression stage 408 is transmitted directly to the first decompression stage 412 without passing through any other processing component, buffer memory, or the like. Such an architecture helps to reduce the latency of the decompression system 136.

As will be discussed in further detail herein, the decompression system 136 decompresses the compressed data file(s) 144 without referencing any header information describing the algorithms or encoders used to create the compressed data file(s) 144. Rather, the decompression system 136 operates with a knowledge of how the compression system 132 operates. Thus, if the compression system 132 applies a first bit encoder 304 on a first chunk of data in a data file as a default condition, the decompression system 136 applies a corresponding first bit encoder on the first chunk of data in the compressed data file 144 as a default condition. The information from the performance feedback circuit 420 is then used in a similar fashion to the way that the compression system uses its performance feedback circuit 220 to select subsequent bit encoders that are used at the second decompression stage 408. As such, the decompression system 136 can efficiently reverse the compression applied by the compression system 132 without having a buffer memory between decompression stages 408, 412 and without relying on header information in the compressed data file 144 to describe which decompression techniques should be used to decompress the data file(s) 144.

As shown in FIG. 5, the second decompression stage 408 may include a plurality of bit encoders 504a-N. Each of the bit encoders 504a-N may correspond to the bit encoders 304a-N in the second compression stage 212. The criteria or rules used to select which bit encoder's 504a-N output will be used as the output of the second decompression stage 408 may be similar or identical to the criteria or rules used to select the bit encoder output at the second compression stage 212. Also similar to the second compression stage 212, the bit encoders 504a-N in the second decompression stage 408 may process the compressed data file(s) 144 on a chunk-by-chunk basis and in parallel with one another. Each bit encoder 504a-N may produce a candidate output and only one of those outputs will be used as the actual output of the second decompression stage 408, which will be provided directly to the first decompression stage 412.

In accordance with at least some embodiments of the present disclosure, the bit encoders 304a-N and bit encoders 504a-N may correspond to different types of bit encoders that produce different outputs for the same data inputs. As non-limiting examples, the bit encoders 304a-N and/or 504a-N may include one or more of bit stream encoders (BSEs), Huffman coders, coders optimized for database files, bit coders optimized for plain text files, bit coders optimized for text files, entropy coders, etc. As mentioned above, the bit encoders 304a-N and/or 504a-N may correspond to hardware encoders, software encoders, or combinations thereof.

With reference now to FIGS. 6A-6D operations of the compression system 132, and specifically the second compression stage 212, will be described in accordance with at least some embodiments of the present disclosure. In some embodiments, the input data chunks 604 provided to the bit encoders may be in the form of data files 124. In such a situation, the bit encoders may correspond to bit encoders of a compression system 132. On the other hand, the input data chunks 604 provided to the bit encoders may be in the form of compressed data files 144, in which case the bit encoders correspond to bit encoders of a decompression system 136. The output chunks 624 may correspond to compressed chunks or decompressed chunks as appropriate. Selection of bit encoders on a chunk-by-chunk basis may be similar or identical at the compression system 132 and decompression system 136; accordingly, the following discussion will refer to input data chunks 604 corresponding to data files 124 and output data chunks 624 corresponding to compressed data files 144. It should be appreciated however, that similar logic may be applied at the decompression system 136 to turn compressed data chunks into decompressed data chunks.

Figure 6A:
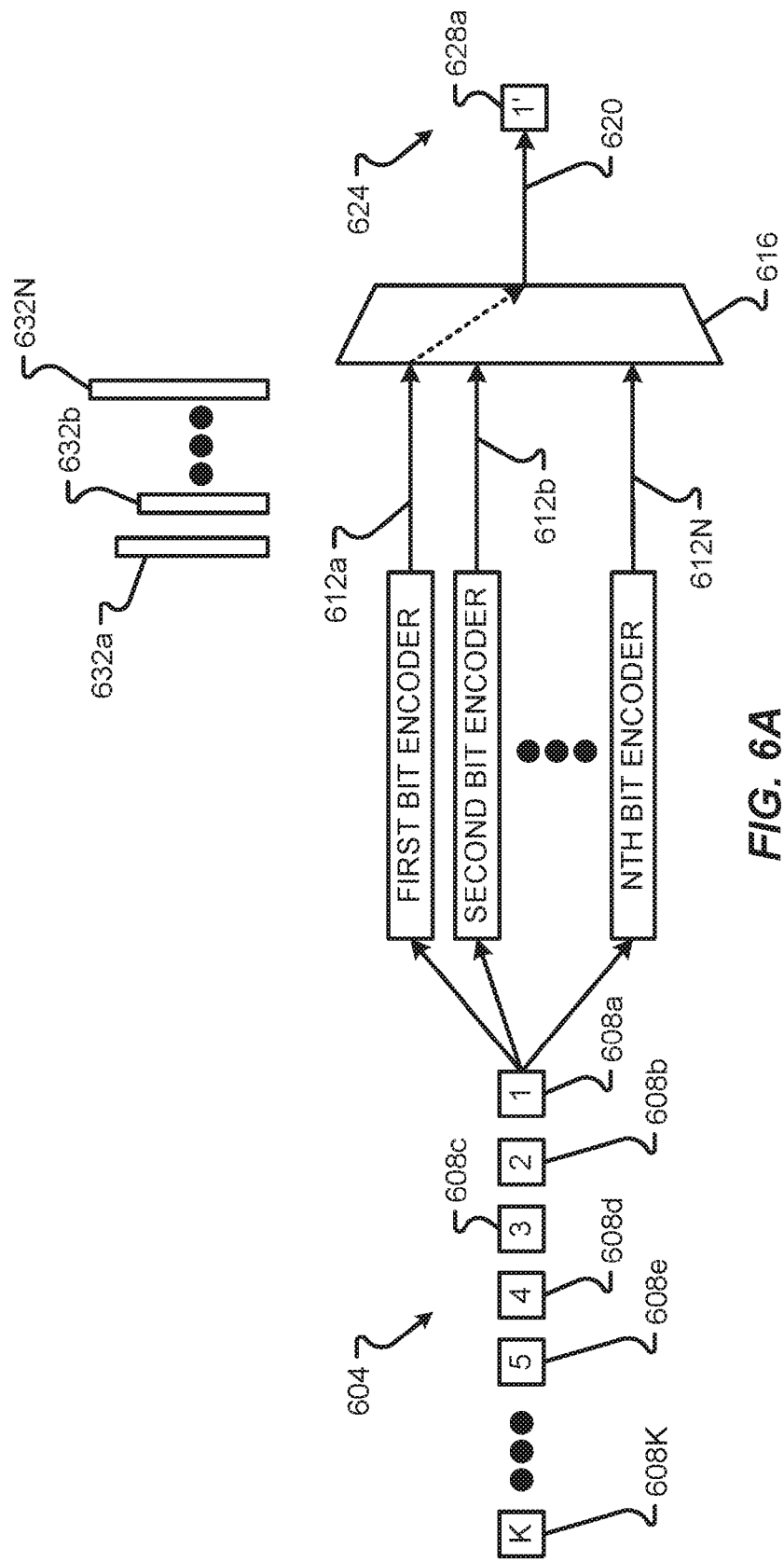
FIG. 6A is a diagram depicting a second compression or decompression stage processing a first chunk of a data file in accordance with embodiments of the present disclosure.

As shown in FIG. 6A, the second compression stage receives input data 604 on a chunk-by-chunk basis. In particular, the input data 604 (e.g., a decompressed data file 124) is divided into a plurality of chunks 608a-K, where K is an integer value greater than or equal to 2. Each chunk 608a-K may be of the exact same size or variable in size but not exceeding a predetermined chunk size. As a non-limiting example, each chunk 608a-K may be between 4B and 16B. As a more specific but non-limiting example, each chunk 608a-K is exactly 4B even though the size of the input data 604 is larger than 4B. Accordingly, an input data may be represented by two or more chunks. In some embodiments, the input data 604 corresponds to an output produced by a first compression stage 208 and that input data 604 may be provided directly to the plurality of bit encoders when produced.

Each bit encoder processes, in parallel, the first chunk 608 during this first stage of processing. As a result, each bit encoder produces an output chunk candidate. In particular, the first bit encoder produces a first chunk candidate 612a, the second bit encoder produces a second chunk candidate 612b, and the Nth bit encoder produces an Nth chunk candidate 612N. At this first stage of processing, each chunk candidate 612a-N is analyzed by the performance feedback circuit 220, 420 to determine a compression performance or compression metric for each of the bit encoders. In the illustrative example, the first bit encoder produces a first chunk candidate 612a having a first compression performance 632a. The second bit encoder produces a second chunk candidate 612b having a second compression performance 632b. The Nth bit encoder produces an Nth chunk candidate 612N having an Nth compression performance 632N.

In the illustrative example, the second compression performance 632b is identified as the best compression metric among all bit encoders. This information is captured by the performance feedback circuit 220, 420 and will be used for selecting an output during processing of subsequent chunks; however, in an effort to avoid delay or latency, the second chunk candidate 612b is not selected for output by the second compression stage. Rather, the first bit encoder was predetermined to have its chunk candidate 612a be used as the selected output during processing of the input data chunks 604. Thus, a selector 616 is used to select the first chunk candidate 612a as the output 620. As a result, the first output chunk 628a (which may correspond to a compressed or decompressed chunk) is taken from the first bit encoders first chunk candidate 612a. The other chunk candidates 612b-N are not used as an output in this stage, but the compression performance 632a-N is used for selecting output(s) at subsequent stages.

Figure 6B:
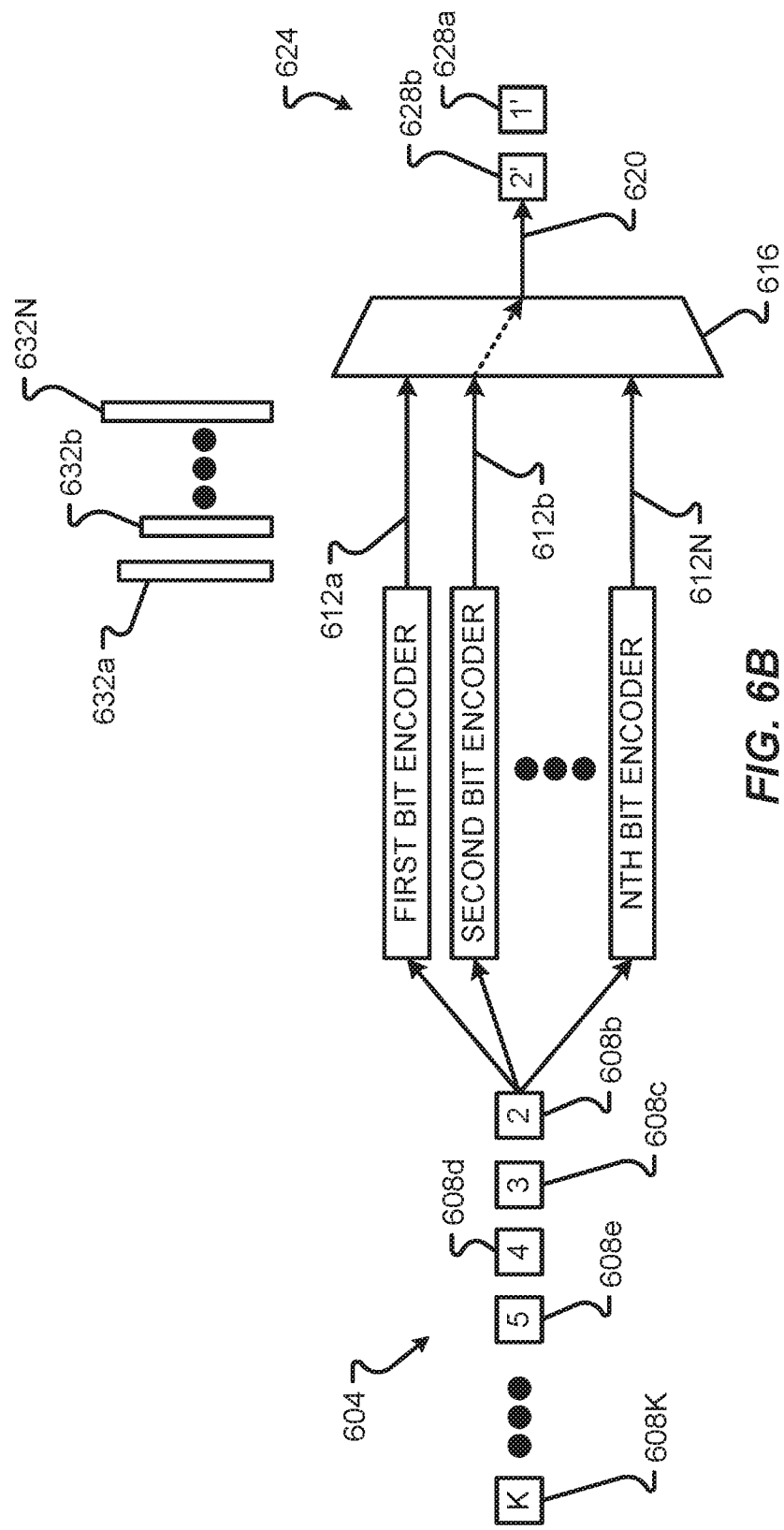
FIG. 6B is a diagram depicting a second compression or decompression stage processing a second chunk of a data file in accordance with embodiments of the present disclosure.

Thus, with reference now to FIG. 6B, a second stage of processing the input data 604 is shown. In this stage, information from the processing of the previous stage may be used to select a better or optimal bit encoder to output the next chunk processed in this stage. In particular, the previous stage resulted in the second bit encoder producing the best compression performance 632b. This information may be used to pre-select the second bit encoder to provide its chunk candidate 612b as the second compressed chunk 628b. Even though the selection of the second bit encoder was already made based on previous compression performance metrics, the compression performance of each bit encoder will continue to be monitored for each chunk. Thus, compression performance metrics 632a-N will continue to be generated by the performance feedback circuit. These metrics 632a-N may contribute to a selection of yet another (and possibly different) bit selector to be used for output subsequent chunks. During processing of the second chunk 608b, however, the second chunk candidate 612b will be selected by the selector 616 and provided as the second compressed chunk 628b. As can be appreciated, now the compressed output 624 includes a chunk output by the first bit encoder and a chunk output by the second bit encoder.

Figure 6C:
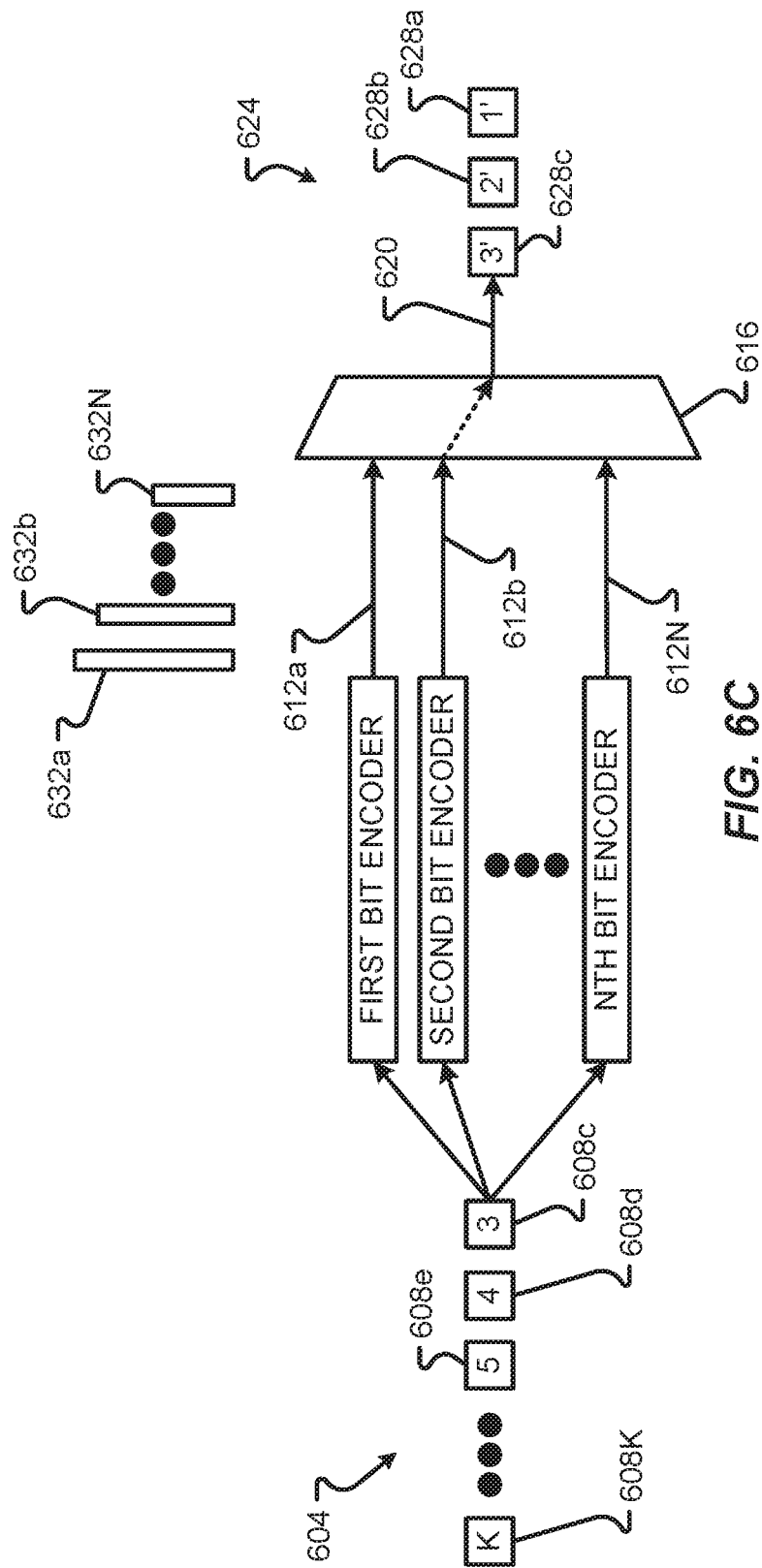
FIG. 6C is a diagram depicting a second compression or decompression stage processing a third chunk of a data file in accordance with embodiments of the present disclosure.

With reference now to FIG. 6C, a third stage of processing the input data 604 is shown. In this stage, the second candidate chunk 612b output by the second bit encoder is still used as the output 620. Thus, the third compressed chunk 628c corresponds to the second candidate chunk 612b output by the second bit encoder. However, FIG. 6C shows that the Nth compression performance 632N now corresponds to the best compression performance among the bit encoders. This information may, or may not, be used for selecting subsequent candidate chunks 612a-N for output with the compressed data 624.

Figure 6D:
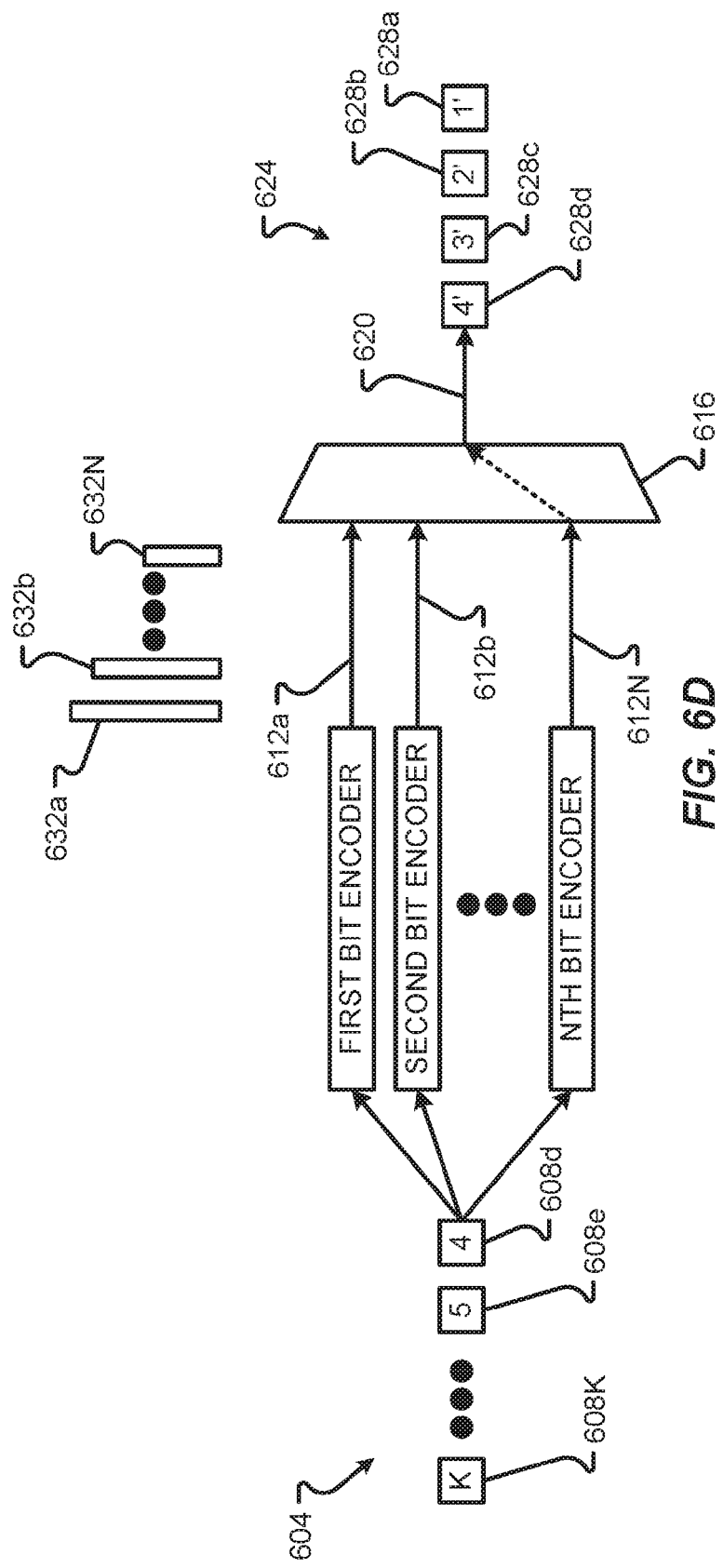
FIG. 6D is a diagram depicting a second compression or decompression stage processing a fourth chunk of a data file in accordance with embodiments of the present disclosure.

FIG. 6D shows a fourth stage of processing the input data 604. In this example, yet another different bit encoder is selected by the selector 616. This change in selection may occur as a result of the compression performance 632a-N changing. Changes in selection of bit encoders may occur any time one bit encoder outperforms another bit encoder on a previous chunk. Alternatively, it may be preferred to assess a cumulative performance of the bit encoders to decide which bit encoder is best-suited for providing an output during processing of a subsequent chunk. As an example, previous cumulative compression performance may be used as a selection metric rather than simply selecting a bit encoder based on a single previous instance of compression performance. Interestingly, in this example, the output data 624 now has chunks 628a, 628b, 628c, and 628d that correspond to outputs of three different bit encoders.

Figure 7:
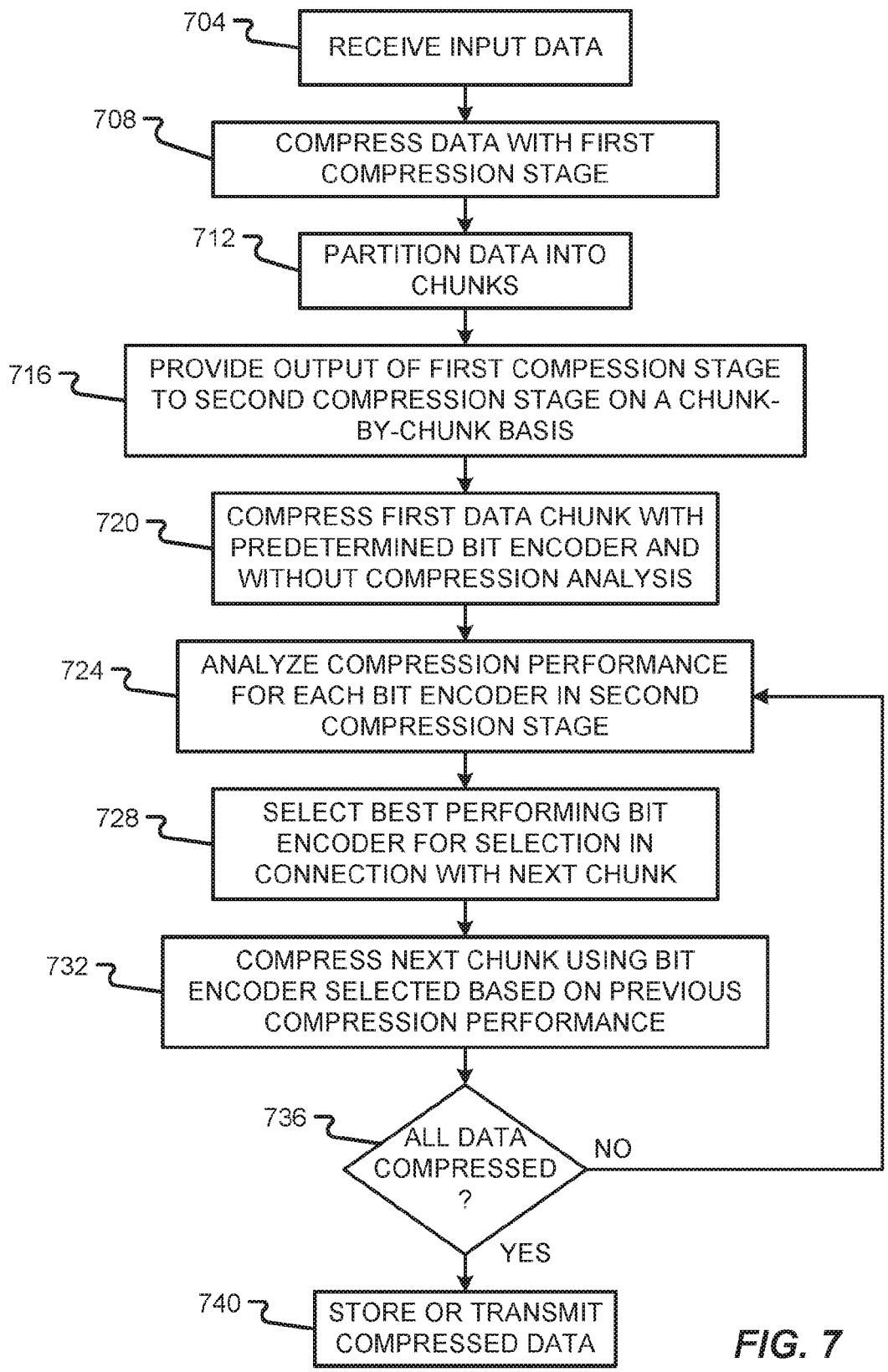
FIG. 7 is a flow diagram depicting a method for semi-dynamically compressing data files in accordance with at least some embodiments of the present disclosure.

With reference now to FIG. 7, a method of semi-dynamically compressing data file(s) 124 with a compression system 132 will be described in accordance with at least some embodiments of the present disclosure. While a general order of the steps is shown, the method can include more or fewer steps or can arrange the order of the steps differently than those shown in FIG. 7. In some embodiments, the method may be performed in full, or in part, by a compression system 132, a backend coder 128, or any other component depicted and described herein.

The method may begin at step 704 by receiving input data from a host system 104. In some embodiments, the input data may comprise one or a plurality of file formats. The input data, in some embodiments, corresponds to a data file 124 or multiple data files 124 received at an input 204 of a compression system 132.

In some embodiments, the method may continue by compressing the data with a first compression stage (step 708) and then partitioning the input data into chunks (step 712). In some embodiments, the data chunks may be partitioned evenly with respect to the file size. Alternatively, the input data may be partitioned into chunks of a predetermined size. In some embodiments, the first compression stage 208 may apply a lossless compression algorithm such as an LZ77, LZ78, or similar type of compression algorithm.

Next the output of the first compression stage 208 is provided directly to a second compression stage 212 (step 716). In this step, the chunks may be provided to the second compression stage 212 immediately after being produced by the first compression stage 208. The first chunk of data received at the second compression stage 212 may be compressed in parallel by a number of bit encoders included in the second compression stage 212. Each bit encoder will produce a candidate chunk as a result of processing the first chunk. In some embodiments, the output of a predetermined bit encoder (e.g., a first bit encoder) is used as the output chunk for the second compression stage 212 (step 720). This decision may be made prior to initiating processing of the input data to help reduce latency of the compression system 132. However, the compression performance of all bit encoders may be analyzed during compression of the first chunk (step 724).

The resulting compression performance analysis for the first data chunk may then be used to determine or select the optimum bit encoder for outputting the next data chunk (step 728). In particular, compression performance for a previous chunk may be used to select a candidate output from among all of the candidate outputs that will produced when processing the next data chunk in the data stream. Accordingly, the method will continue by compressing the next chunk in the input data with the newly-selected bit encoder (if different from the previously-selected bit encoder) (step 732). As can be appreciated, during processing of each chunk, all bit encoders in the compression system 132 will process the same chunk in parallel with one another. The outputs of each bit encoder will be analyzed and possibly used to select the next bit encoder that will provide its output as the output of the compression system. This process will continue until it is determined that all data chunks in the input data are compressed (step 736).

After all data chunks of the input data are compressed, the method will continue by storing or transmitting the compressed data (step 740). The compressed data may be transmitted as a single compressed file or in compressed chunks. Advantageously, there is no need to store additional header bits or other information describing which bit encoder was used during compression of the input data. Rather, the decompression system 136 will apply the same rules or criteria in connection with selecting a particular bit encoder for any particular chunk. As such, the amount of data stored or transmitted in connection with the compressed data file is limited to the data needed to store actual data and does not need to include additional space for other metadata.

Figure 8:
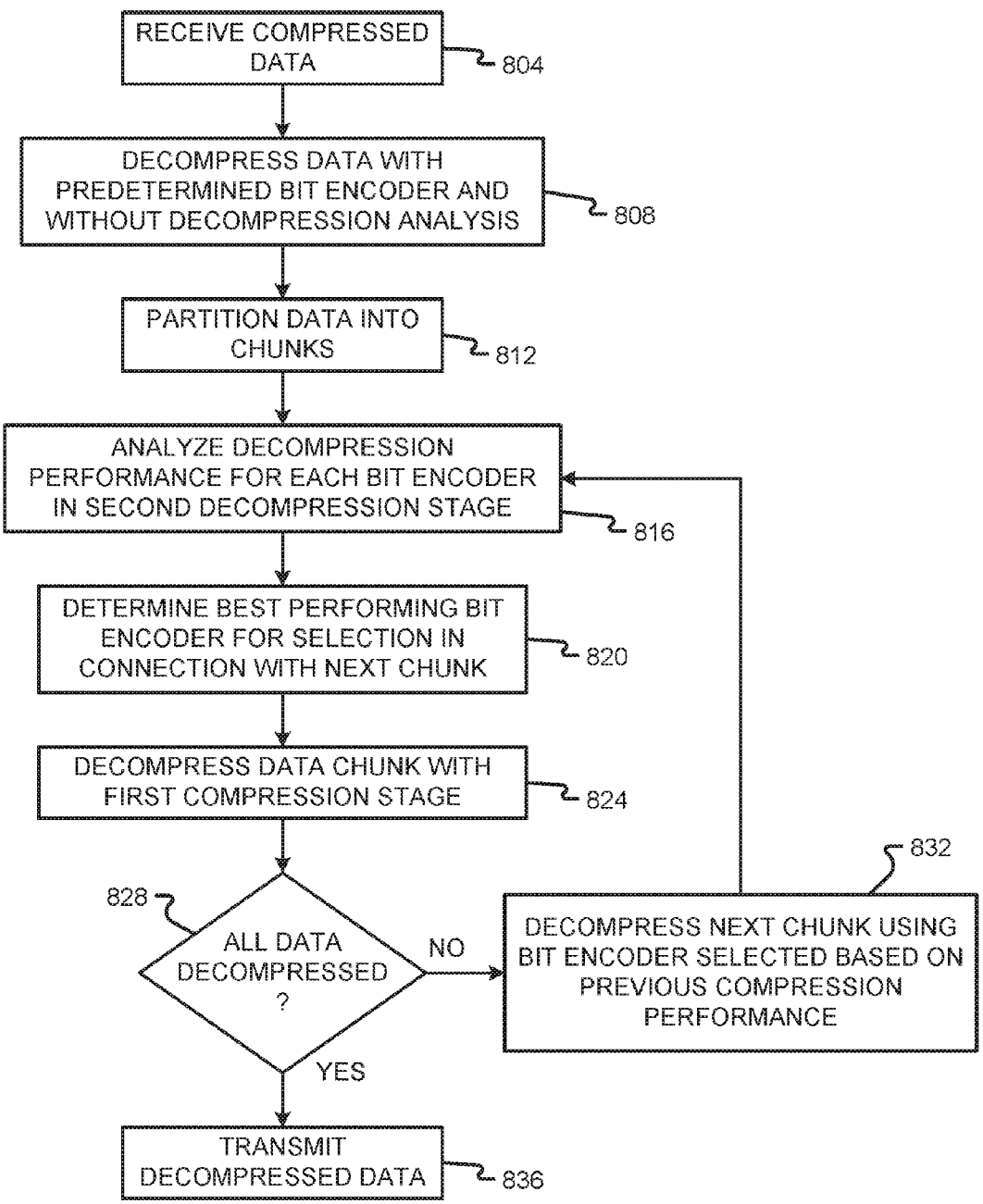
FIG. 8 is a flow diagram depicting a method for semi-dynamically decompressing data files in accordance with at least some embodiments of the present disclosure.

With reference now to FIG. 8, a method for semi-dynamically decompressing data file(s) 144 will be described in accordance with at least some embodiments of the present disclosure. While a general order of the steps is shown, the method can include more or fewer steps or can arrange the order of the steps differently than those shown in FIG. 8. In some embodiments, the method may be performed in full, or in part, by a decompression system 136, a backend coder 128, or any other component depicted and described herein.

The method begins when compressed data is received at the decompression system 136 (step 804). The compressed data may be received in the form of a compressed data file 144 at the input 404 of the decompression system 136.

The compressed data is then decompressed with a predetermined bit encoder and without any type of decompression analysis (step 808). The decompressed data may then be partitioned into chunks (step 812). The data chunks may be partitioned evenly with respect to the compressed file size. Alternatively, the input data may be partitioned into chunks of a predetermined size. In some embodiments, the data is initially decompressed using all bit encoders of the second decompression stage 408. In some embodiments, the output of a predetermined bit encoder is used as the actual output of the second decompression stage. However, compression (or decompression) performance is analyzed for each bit encoder in the second decompression stage (step 816). This compression performance information is used to determine a best-performing bit encoder for a next chunk of the input data (step 820). As mentioned above, the selection of a particular bit encoder may be made based on a previous performance metric or a cumulative assessment of multiple previous performance metrics for each of the bit encoders in the second decompression stage.

The method continues by providing the output data chunk of the second decompression stage directly to the first decompression stage (step 824). The first decompression stage will decompress the data chunk using its decompression algorithm, thereby producing a fully-decompressed data chunk. The method continues by determining if all data chunks in the input data have been decompressed (step 828). If this query is answered negatively, then the method continues by enabling the second decompression stage to decompress the next data chunk with a bit encoder that was selected based on previous compression performance metrics (step 832). The method then returns to step 816 and further analysis is performed for all of the bit encoders that have decompressed the second chunk of data in parallel with one another.

Once all of the data chunks for the input data have been decompressed, the data is prepared for transmission (step 836). In some embodiments, the decompressed data is provided to a requesting host or to a remote host system.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

Any of the steps, functions, and operations discussed herein can be performed continuously and automatically.

The exemplary systems and methods of this disclosure have been described in relation to a semi-dynamic system of compressing and decompressing data. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

What is claimed is:

1. A data compression system, comprising:
   a first compression stage that receives input data and produces a first compressed output, wherein the first compression stage compresses the input data to the first compressed output without data loss; and
   a second compression stage that is connected to the first compression stage such that the second compression stage receives the first compressed output and produces a second compressed output, wherein the second compression stage compresses the first compressed output to the second compressed output without data loss, wherein the second compression stage comprises a plurality of different bit encoders that compress the first compressed output on a chunk-by-chunk basis and in parallel thereby producing different compressed chunk candidates in parallel with one another, and wherein a first bit encoder is selected from the plurality of different bit encoders to provide a first compressed chunk candidate as part of the second compressed output in response to the first bit encoder producing a smaller compressed chunk candidate than other bit encoders in the plurality of different bit encoders on a previously-compressed chunk.

2. The data compression system of claim 1, where the second compression stage is directly connected to the first compression stage such that an input received at the second compression stage is the first compressed output that has not travelled through a delay line or buffer.

3. The data compression system of claim 1, wherein the first bit encoder is selected at a first time and wherein a second bit encoder is selected from the plurality of different bit encoders at a second time following the first time to provide a second compressed chunk candidate as part of the second compressed output in response to the second bit encoder producing a smaller chunk candidate than the first bit encoder and other bit encoders in the plurality of different bit encoders on the first compressed chunk.

4. The data compression system of claim 3, wherein the first compressed chunk candidate and the second compressed chunk candidate are both included in the second compressed output.

5. The data compression system of claim 4, wherein the input data is received from a single data file and wherein the second compressed output is stored in computer memory as a compressed version of the single data file even though both the first bit encoder and second bit encoder contributed compressed chunk candidates to the second compressed output.

6. The data compression system of claim 1, wherein the first compression stage comprises a dictionary coder.

7. The data compression system of claim 1, wherein the plurality of different bit encoders are each optimized for different file or data types.

8. The data compression system of claim 1, wherein the bit encoder is dynamically and continuously enabled to select different bit encoders from the plurality of different bit encoders for different chunks based on each bit encoder's performance during preceding data chunks.

9. A data decompression system, comprising:
   a first decompression stage that utilizes a lossless decompression algorithm; and
   a second decompression stage that is connected to the first decompression stage such that the second decompression stage receives input data and produces a first decompressed output that is provided directly to the first decompression stage, wherein the second compression stage comprises a plurality of different bit encoders that decompress the input data on a chunk-by-chunk basis and in parallel thereby producing different decompressed chunk candidates in parallel with one another, and wherein a first bit encoder is selected from the plurality of different bit encoders to provide a first decompressed chunk candidate as part of the first decompressed output in response to the first bit encoder producing a chunk candidate having better compression parameters associated therewith as compared to other bit encoders in the plurality of different bit encoders on a previously-decompressed chunk.

10. The data decompression system of claim 9, where the second decompression stage is directly connected to the first decompression stage such that an input received at the first decompression stage is the first decompressed output that has not travelled through a delay line or buffer.

11. The data decompression system of claim 9, wherein the first bit encoder is selected at a first time and wherein a second bit encoder is selected from the plurality of different bit encoders at a second time following the first time to provide a second decompressed chunk candidate as part of the first decompressed output in response to the second bit encoder producing a chunk candidate having better compression parameters associated therewith as compared to the first bit encoder and other bit encoders in the plurality of different bit encoders on the first decompressed chunk.

12. The data decompression system of claim 11, wherein the first decompressed chunk candidate and the second decompressed chunk candidate are both included in the first decompressed output and wherein the first decompressed output corresponds to a data file that is provided to a host.

13. The data decompression system of claim 9, wherein the first decompression stage comprises a dictionary coder.

14. The data decompression system of claim 9, wherein the plurality of different bit encoders are each optimized for different file or data types.

15. A low latency dynamic coder, comprising:
a compression side, comprising:
an input that receives input data to be stored in memory;
a first compression stage that receives the input data and produces a first compressed output, wherein the first compression stage utilizes a lossless compression algorithm; and
a second compression stage that is connected to the first compression stage such that the second compression stage receives the first compressed output and produces a second compressed output, wherein the second compression stage includes:
a first bit encoder configured to compress the first compressed output on a chunk-by-chunk basis thereby producing a first set of compressed chunk candidates; and
a second bit encoder configured to compress the first compressed output on a chunk-by-chunk basis and in parallel with the first bit encoder thereby producing a second set of compressed chunk candidates in parallel with the first set of compressed chunk candidates, wherein outputs of the first or second bit encoder are included in the second compressed output based on which bit encoder produced a smaller compressed chunk candidate on a preceding data chunk;
a decompression side, comprising:
a second decompression stage that receives the second compressed output and produces a first decompressed output, wherein the second decompression stage includes the first bit encoder and the second bit encoder; and
a first decompression stage that receives the first decompressed output and produces a second decompressed output, wherein the second decompressed output is identical to the input data and wherein the first decompression stage utilizes the lossless compression algorithm used by the first compression stage.

16. The low latency dynamic coder of claim 15, wherein the input data is partitioned into chunks of a predetermined size.

17. The low latency dynamic coder of claim 15, wherein the first bit encoder or second bit encoder is used as the second decompression stage to decompress a chunk of data based on whether the first bit encoder or second bit encoder is used to compress the same chunk of data.

18. The low latency dynamic coder of claim 17, wherein no header bits are used to communicate to the decompression side whether the first bit encoder or second bit encoder is used to compress the chunk of data.

19. The low latency dynamic coder of claim 15, wherein the input data comprises a data file.

20. The low latency dynamic coder of claim 15, wherein the first compression stage is directly connected to the second compression stage and wherein the second decompression stage is directly connected to the first decompression stage.

* * * * *